United States Patent
Wells et al.

(10) Patent No.: US 10,716,232 B2
(45) Date of Patent: Jul. 14, 2020

(54) LOW PROFILE, NESTING CAPACITOR COLLARS

(71) Applicant: Raytheon Company, Waltham, MA (US)

(72) Inventors: Derek B. Wells, Wilmington, MA (US); Kenneth P. Walsh, Jr., Andover, MA (US); Gregory S. Renaud, Dracut, MA (US); Dimitry Zarkh, Waltham, MA (US)

(73) Assignee: Raytheon Company, Waltham, MA (US)

( * ) Notice: Subject to any disclaimer, the term of this patent is extended or adjusted under 35 U.S.C. 154(b) by 24 days.

(21) Appl. No.: 16/109,519

(22) Filed: Aug. 22, 2018

(65) Prior Publication Data

US 2020/0068738 A1 Feb. 27, 2020

(51) Int. Cl.
*H05K 7/14* (2006.01)
*H05K 1/18* (2006.01)
*H05K 3/32* (2006.01)

(52) U.S. Cl.
CPC .............. *H05K 7/14* (2013.01); *H05K 1/181* (2013.01); *H05K 3/32* (2013.01); *H05K 7/1422* (2013.01);
(Continued)

(58) Field of Classification Search
CPC ............ H05K 7/14; H05K 1/181; H05K 3/32; H05K 7/1422; H05K 2201/10015; H05K 2201/10522; H05K 2201/2045
See application file for complete search history.

(56) References Cited

U.S. PATENT DOCUMENTS

| 2,762,989 A | 9/1956 | Johnson |
| 3,229,939 A | 1/1966 | Hubbard |

(Continued)

FOREIGN PATENT DOCUMENTS

| DE | 10-2005-056043 A1 | 2/2007 |
| EP | 1132930 A1 | 9/2001 |

(Continued)

OTHER PUBLICATIONS

Invitation to Pay Additional Fees for International Application No. PCT/US2019/037775 dated Oct. 14, 2019, 17 pages.

(Continued)

*Primary Examiner* — James Wu
*Assistant Examiner* — Hung Q Dang

(57) ABSTRACT

A mounting collar comprises a collar body comprising an opening for receiving at least a portion of an electronics component (e.g., capacitor) of an electronics assembly, and a radial retention component supported about an inner surface (e.g., annular groove) of the opening of the collar body. The radial retention component (e.g., elastomeric O-ring) is operable to apply a radial force on the electronics component to at least partially support the electronics component. A mounting system comprises a first mounting collar for mounting a first electronics component to a support structure, and a second mounting collar for mounting a second electronics component to the support structure. The first and second mounting collars can be nested together to minimize a distance between the first and second electronics components. The first and second mounting collars can each comprise an elastomeric O-ring to reduce strain between the electronics components and the circuit board. Associated systems and methods are provided.

21 Claims, 5 Drawing Sheets

(52) U.S. Cl.
CPC .............. *H05K 2201/10015* (2013.01); *H05K 2201/10522* (2013.01); *H05K 2201/2045* (2013.01)

(56) References Cited

U.S. PATENT DOCUMENTS

| | | |
|---|---|---|
| 3,237,905 A | 3/1966 | Baker et al. |
| 3,895,832 A | 7/1975 | Ellis et al. |
| 4,088,327 A | 3/1978 | Bachle |
| 4,182,519 A | 1/1980 | Wilson |
| 5,880,926 A | 3/1999 | Nishino et al. |
| 6,262,360 B1 | 7/2001 | Michel |
| 7,396,249 B2 | 7/2008 | Kauffman |
| 7,455,328 B2 | 11/2008 | Chelchowski et al. |
| 7,485,815 B2 | 2/2009 | Frank |
| 9,585,255 B2 | 2/2017 | Mercier et al. |
| 2004/0094688 A1 | 5/2004 | Michel et al. |
| 2008/0291653 A1 | 11/2008 | Sailor et al. |
| 2011/0222261 A1 | 9/2011 | Zengerle et al. |
| 2012/0077356 A1* | 3/2012 | Shimizu .................. H01G 2/06 439/55 |
| 2013/0260622 A1* | 10/2013 | Kjellman ................. B63H 5/07 440/111 |

FOREIGN PATENT DOCUMENTS

| | | |
|---|---|---|
| EP | 1840911 A1 | 10/2007 |
| JP | H06-120082 A | 4/1994 |

OTHER PUBLICATIONS

International Search Report for International Application No. PCT/US2019/037775 dated Dec. 6, 2019, 22 pages.

* cited by examiner

LOW PROFILE, NESTING CAPACITOR COLLARS

BACKGROUND

Traditional clamps for securing capacitors to a support structure of an electronics assembly typically utilize a radial fastener to generate a clamping force around the capacitor (much like some pipe clamps). However, such radial fastening arrangements require a particular footprint area (i.e., xy area) of the electronics assembly in order to install the clamp, because of the lateral distance of the radial fastener portion that extends outwardly/laterally (and because of the clearance required to insert a tool (screw driver) in a radial direction to install the clamp. This negatively influences the distance between adjacent capacitors by increasing such distance, which therefore increases the envelope size of a particular electronics assembly. Because of this, such capacitor clamps result in inefficient and less dense component packaging and assembly time than might otherwise be necessary.

These traditional capacitor clamps also provide a rigid-to-rigid interface connection from the support structure to the capacitor via the clamp. Thus, with experienced shock and/or vibration on the electronics assembly (e.g., such as might occur in rugged environments), the capacitors are often strained at their pinned or solder connection point to a circuit board because such shock and/or vibration loads readily transfer directly through such rigid-to-rigid interface connections. This is particularly problematic in applications that use a number of adjacent larger, high-voltage capacitors (e.g., those used in radar systems) where the capacitors are desired to be as tightly packaged together as possible due to envelope limitations of the overall electronics assembly. In such systems, these high-voltage capacitors have a larger mass as compared to much smaller capacitors used in smaller electronics assemblies (e.g., PC computers, etc.). The relatively large mass of these high-voltage capacitors makes them more prone to strain as a result of shock and/or vibration imparted on the capacitors.

Moreover, such high-voltage capacitors often require incorporation of an insulation sleeve (e.g., plastic) wrapped around the capacitor, which limits the options for mounting the capacitors because the insulation sleeve cannot be removed or tampered with. In the case of radar systems, a large number of high-voltage capacitors must be closely packaged together and near the radiating elements of the radar system, which is difficult to achieve with traditional capacitor clamps.

Therefore, there is a desire to address these problems (i.e., packaging size and strain) with one or more types of clamps that provide a smaller, more efficient packaging system, and/or that reduce or eliminate strain on the electrical connection interface between the capacitors and a circuit board.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1A:
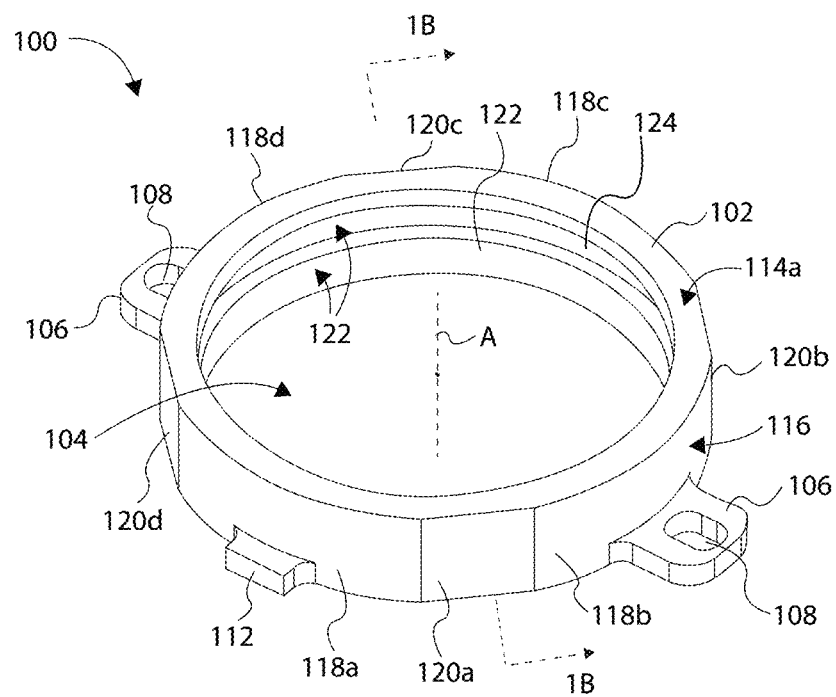
FIG. 1A is an isometric view of a first mounting collar in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

The present disclosure sets forth a mounting collar comprising a collar body comprising an opening for receiving at least a portion of an electronics component of an electronics assembly, and a radial retention component supported about an inner surface of the opening of the collar body. The radial retention component can be operable to apply a radial force on the electronics component to at least partially support the electronics component.

In one example, the collar body comprises an annular groove formed about the inner surface, and the radial retention component is at least partially disposed within the annular groove.

In one example, the radial retention component comprises an elastomeric O-ring operable to elastically deform to apply the radial force on the electronics component.

The present disclosure sets forth a mounting system for mounting electronic components within an electronics assembly comprising a first mounting collar coupleable to a support structure of an electronics assembly, and comprising a collar body for mounting a first electronics component to the support structure. A second mounting collar is coupleable to the support structure adjacent the first mounting collar. The second mounting collar comprises a collar body for mounting a second electronics component to the support structure, and has a riser collar portion and a base collar portion with a body width greater than that of the base collar portion. The collar body of the first mounting collar is operable to nest with the second mounting collar at a position adjacent the base collar portion when the first and second mounting collars are coupled to the support structure.

In one example, the system can further comprise a first radial retention component is supported about an inner surface of the collar body of the first mounting collar, and a second radial retention component is supported about an inner surface of the collar body of the second mounting collar. Each radial retention component (e.g., elastomeric O-ring) is operable to apply a radial force on the respective first and second electronics components.

In one example, the system can further comprise a plurality of first mounting collar attached to the support structure, and a plurality of second mounting collars attached to the support structure and nested with adjacent first mounting collars.

The present disclosure sets forth an electronics assembly comprising: a chassis; a circuit board coupled to the chassis; a support structure coupled to the chassis and spatially separated from the circuit board, and comprising an array of apertures; a plurality of electronics components electrically coupled to the circuit board and extending through respective apertures of the support structure; a plurality of first mounting collars attached to the support structure for mounting respective electronics components to the support structure; and a plurality of second mounting collars attached to the support structure for mounting respective electronics components to the support structure (the second mounting collars can be arranged in an alternating manner relative to the first mounting collars). The first mounting collars can be nested relative to adjacent second mounting collars to maximize the density of the electronics components relative to the circuit board.

The present disclosure sets forth a method of mounting a plurality of electronics components to an electronics assembly comprising: electrically coupling a plurality of electronics components to a circuit board supported by a chassis; attaching a support structure to the chassis, such that ends of the plurality of electronics components are disposed through respective apertures of the support structure; attaching a plurality of first mounting collars to the support structure in an alternating manner for mounting respective electronics components to the support structure; and attaching a plurality of second mounting collars to the support structure in an alternating manner relative to the first mounting collars for mounting respective electronics components to the support structure. The first mounting collars can be nested relative to adjacent second mounting collars to maximize the density of the electronics components relative to the circuit board.

To further describe the present technology, examples are now provided with reference to the figures. As an overview, the present disclosure sets forth a mounting system comprising complementary mounting collars (e.g., FIGS. 1A and 2A) that operate together for mounting electronic components (e.g., capacitors) within an electronics assembly (e.g., a CCA of a radar or other electronics system). Unlike and as compared with prior mounting devices, the mounting collars (e.g., mounting collars 100 and 200) can be nested with each other in an alternating manner (FIGS. 3-5) to maximize or increase the density of the electronics components relative to the area of a circuit board electrically coupled to the electronics components (i.e., the capacitors can be closer together than possible with traditional clamps).

Figure 1B:
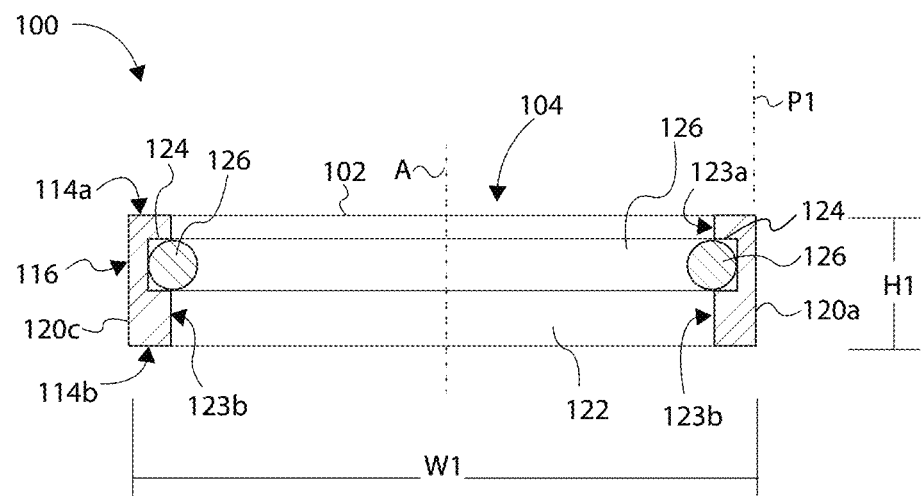
FIG. 1B is a cross sectional view of the first mounting collar of FIG. 1A taken along lines 1B-1B, also showing a radial retention component (e.g., O-ring) of the first mounting collar.
Figure 2A:
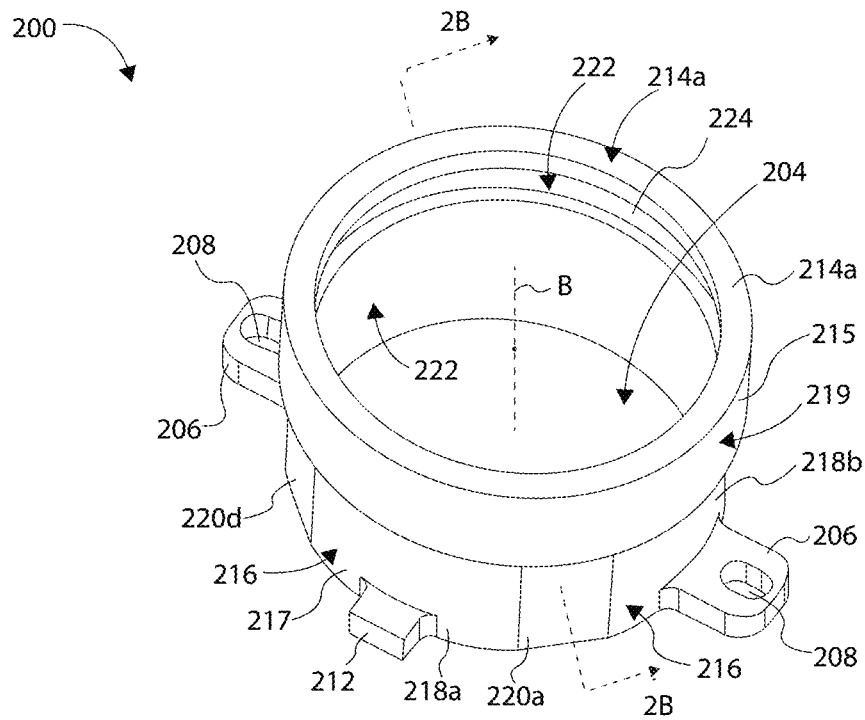
FIG. 2A is an isometric view of a complementary second mounting collar in accordance with an example of the present disclosure.
Figure 2B:
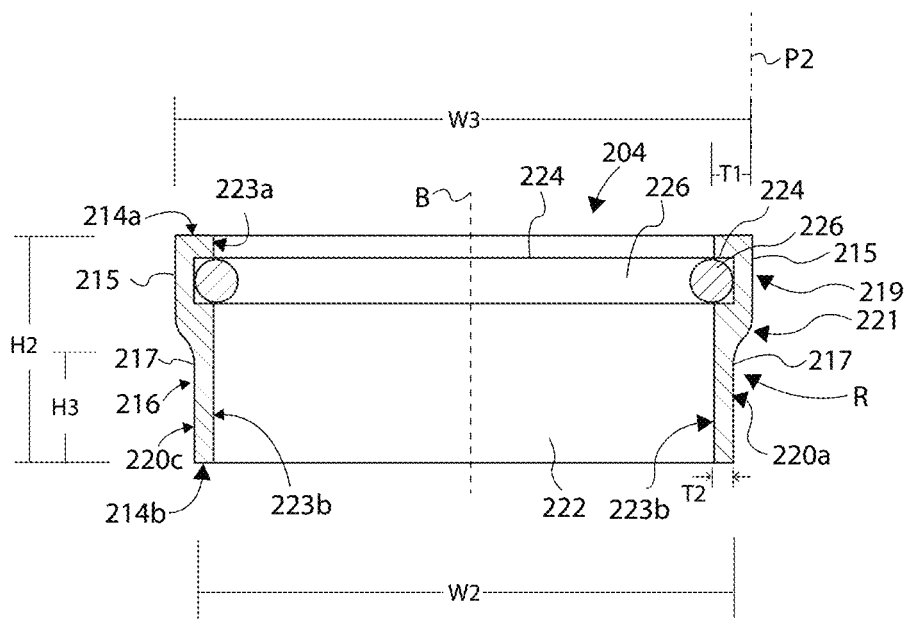
FIG. 2B is a cross sectional view of the second mounting collar of FIG. 2A taken along lines 2B-2B, also showing a radial retention component (e.g., O-ring) of the second mounting collar.
Figure 3:
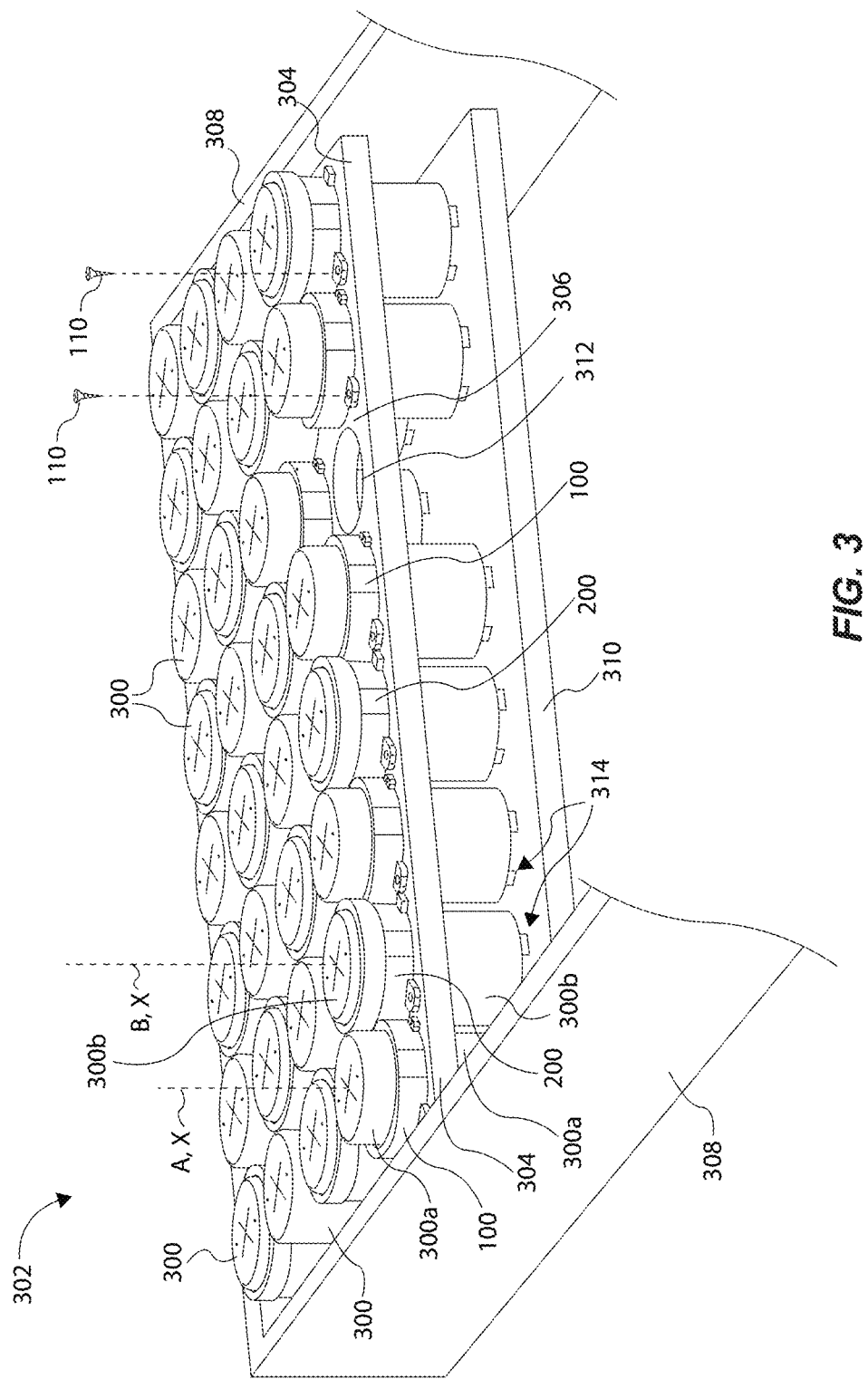
FIG. 3 is an isometric view of a portion of an electronics assembly incorporating a plurality of pairs of the first and second mounting collars of FIGS. 1A-2B nested together and supporting a plurality of electronics components (e.g., capacitors) electrically coupled to a circuit board in accordance with an example of the present disclosure.

More specifically, FIGS. 1A and 1B illustrate a first mounting collar 100, and FIGS. 2A and 2B illustrate a second mounting collar 200 that is that complements (e.g., that nests) with the first mounting collar 100, as further detailed below regarding FIGS. 3-5. With reference to FIGS. 1A and 1B and FIG. 3, the first mounting collar 100 can comprise a collar body 102 defining and having an opening 104 for receiving at least a portion of an electronics component (e.g., see electronics component 300a in the form of a capacitor of the electronics assembly 302 of FIGS. 3-5). A pair of attachment tabs 106 can extend outwardly from the collar body 102, and each tab 106 can comprise an opening 108 for receiving a fastener 110 (FIG. 3) operable to attach the first mounting collar 100 to a support structure 304 of the electronics assembly 302. The attachments tabs 106 can be formed on opposing sides of the collar body 102, and can be positioned near a bottom edge or base of the collar body 102 (that portion of the collar body 102 intended to come in contact with the mounting surface 306 of the support structure 304 of the electronics assembly 302). Similarly, a pair of support tabs 112 can extend outwardly from the collar body 102. The support tabs 112 can be positioned along an axis oriented generally ninety degrees from or orthogonal to an axis extending through adjacent attachment tabs 106. The support tabs 112 can interface with a mounting surface 306 of the support structure 304 for providing lateral support to the first mounting collar 100 and the supported electronics component 300a.

The collar body 102 can be a continuous or uniform ring-shaped body that can comprise an upper surface 114a and a lower surface 114b. The lower surface 114b can interface with (i.e., rest or be seated against) and can be biased to the mounting surface 306 of the support structure 304 (FIG. 3), while the upper surface 114a is exposed adjacent the second mounting collar 200 as discussed below. The collar body 102 can comprise a perimeter surface 116 that extends around an outer perimeter of the collar body 102. In one example, the perimeter surface 116 can be configured generally as a cylinder, such that the collar body 102 has a diameter and circumference. In the example shown in FIG. 1A, the perimeter surface 116 can further vary around the perimeter of the collar body 102. For instance, the perimeter surface 116 can have a plurality of curved surfaces 118a-d separated by a plurality of mounting surfaces 120a-d. The mounting surfaces 120a-d can extend generally parallel to a central axis A of the collar body 102.

At each of the mounting surfaces 120a and 120c, the collar body 102 has a uniform surface that extends along a height H1 of the collar body 102. Note that the collar body 102, at the location of the cross section 1B-1B shown in FIG. 1B, comprises a width W1 defined between mounting surfaces 120a and 120c. The width W1 can also be a diameter of the collar body (in the example where the entire perimeter surface 116 is uniformly or consistently curved). As further discussed below, the mounting surfaces 120a and 120c (and also 120b and 120d) provide a reduced cross sectional area of the collar body 102 to further facilitate nesting between adjacent second mounting collar(s) 200.

The collar body 102 can comprise an inner surface 122 that extends generally vertically between the upper and lower surfaces 114a and 114b. The inner surface 122 of the collar body 102 can further comprise an annular groove 124 formed therein, as well as an upper inner mounting surface 123a and a lower inner mounting surface 123b. In the example shown, the annular groove 124 is situated axially between the upper and lower inner mounting surfaces 123a and 123b. The annular groove 124 can support or retain a radial retention component 126 (e.g., an elastomeric O-ring). The radial retention component 126 can be operable to elastically deform and apply a radial compression force on an outer surface of the electronics component 300a to axially and radially support the electronics component 330a, as further discussed below. Thus, the radial retention component 126 can be sized and shaped to be supported in the annular groove 124, such that an inner portion of the radial retention component 126 can radially compress against an outer surface of the electronics component 300a (see e.g., FIG. 5). Therefore, the radial retention component 126 can support the electronics component 300a axially along central axis A, and radially or laterally relative to central axis A. In this arrangement, the collar body 102 can be sized so as to be only slightly larger (e.g., larger in its inside diameter) than the electronics component 300a (e.g., its outer diameter), such that it fits over the electronics component 300a. In addition, the radial retention component 126 can be sized to be slightly smaller (e.g., smaller in its inside diameter) than the electronics component 300a (e.g., its outer diameter), such that it can be elastically deformed to apply a radial force inward against the electronics component 300a. As such, the collar body 102, the annular groove 124 and the radial retention component 126 can be tailored to meet the requirements of a particular electronics component, so as to function as intended.

Note that the collar body 102, the annular groove 124, and the radial retention component 126 share a common central axis A, and consequently, a longitudinal axis X of the electronics component 300a is generally collinear with central axis A.

With reference to FIGS. 2A and 2B, and FIG. 3, shown is the second mounting collar 200 that complements (i.e., that nests with) the first mounting collar 100 (or multiple first mounting collars), as introduced above and as further detailed below regarding FIGS. 3-5. The second mounting collar 200 can comprise a collar body 202 having and defining an opening 204 for receiving at least a portion of an electronics component 300b of an electronics assembly 302 (see FIGS. 3-5). A pair of attachment tabs 206 can extend outwardly from the collar body 202 (near the bottom edge or base of the collar body 202), and each tab 206 can comprise an opening 208 for receiving a fastener 110 (FIG. 3) to attach the second mounting collar 200 to the mounting surface 206 of the support structure 304 of the electronics assembly 302. The attachments tabs 206 can be formed on opposing sides of the collar body 202. Similarly, a pair of support tabs 212 can extend outwardly from the collar body 202 along an axis oriented generally ninety degrees from, or orthogonal to, adjacent attachment tabs 206. The support tabs 212 can interface with (i.e., rest on or be seated against) the mounting surface 306 of the support structure 304 for providing lateral support to the second mounting collar 200 and the supported electronics component 300b, similarly as described regarding the first mounting collar 100.

Alternatively, rather than using tabs 106 and 206, respectively, to mount the first and second mounting collars 100, 200, the first and second mounting collars 100, 200 can be adhered to the mounting surface 306 of the support structure 304. In still another alternative, the first and second collar bodies 102 and 202 can comprise a threaded portion along their base that facilitates the first and second mounting collars 100, 200, respectively, being threaded into corresponding threaded apertures formed in the mounting surface 306 of the support structure 304.

The collar body 202 can comprise a riser collar portion 215 and a base collar portion 217 that together define a height H2 that is greater than height H1 of the first mounting collar 100. A lower surface 214b of the base collar portion 217 can be biased to or can interface with the mounting surface 306 of the support structure 304 (FIG. 3), while an upper surface 214a of the riser collar portion 215 can be exposed adjacent the electronics component 300b.

Similarly, as described above regarding the first mounting collar 100, the base collar portion 217 can comprise a perimeter surface 216 that extends around an outer perimeter of the base collar portion 217 of the collar body 202. In one example, the perimeter surface 216 can be configured generally as a cylinder, such that the collar body 202 has a diameter and circumference. In the example shown in FIG. 2A, the perimeter surface 216 can further vary around the perimeter. For example, the perimeter surface can have a plurality of curved surfaces 218a-d (only 218a, b are labeled/shown) separated by a plurality of mounting surfaces 220a-d (only 220a, c, and d are labeled/shown). The mounting surfaces 220a-d can extend generally parallel to a central axis B of the collar body 202.

Note that the collar body 202, at the location of the cross section 2B-2B shown in FIG. 2B, comprises a width W2 defined between mounting surfaces 220a and 220c. The width W2 can also be a diameter of the collar body (in the example where the entire perimeter surface 116 is uniformly or consistently curved). As further discussed below, the mounting surfaces 220a and 220c (and also 220b and 220d) provide a reduced cross sectional area of the collar body 202 to further facilitate nesting between adjacent first mounting collar(s) 100.

The riser collar portion 215 can be formed as an annular ring portion extending above or vertically upward (with reference to the drawings) from the base collar portion 215. The riser collar portion 215 can comprise an outer perimeter surface 219 having a diameter or width W3 that is greater than width W2 (and width W1 of mounting collar 100). As shown best in FIG. 2B, a transition portion 221 extends between the riser collar portion 215 and the base collar portion 217 about the perimeter portion 216. The transition portion 221 can comprise a curved surface, a linear inclined surface, as shown, or a linear surface oriented orthogonal to the perimeter surfaces 216 and 219 so as to form a step or shoulder. The riser collar portion 215, the base collar portion 217, and the transition portion 221 together facilitate nesting of the first and second mounting collars 100 and 200, as further discussed below.

The collar body 202 can comprise an inner surface 222 that extends generally vertically between the upper and lower surfaces 214a and 214b. The inner surface 222, and particularly that portion about the riser collar portion 215, can further comprise an annular groove 224 formed therein, as well as an upper inner mounting surface 223a and a lower inner mounting surface 223b. In the example shown, the annular groove 224 is situated axially between the upper and lower inner mounting surfaces 223a, 223b. The annular groove 224 can support or retain a radial retention component 226 (e.g., an elastomeric O-ring). The radial retention component 226 can be operable to elastically deform and apply a radial compression force on an outer surface of the electronics component 300b to axially and radially support the electronics component 330b, as further discussed below. Thus, the radial retention component 226 can be sized and shaped to be supported in the annular groove 224, such that an inner portion of the radial retention component 226 is compressed against an outer perimeter surface of the electronics component 300b to support it axially relative to the central axis B, and also radially relative to the central axis B. In this arrangement, the collar body 202 can be sized so as to be only slightly larger (e.g., larger in its inside diameter) than the electronics component 300a (e.g., its outer diameter), such that it fits over the electronics component 300a. In addition, the radial retention component 226 can be sized to be slightly smaller (e.g., smaller in its inside diameter) than the electronics component 300a (e.g., its outer diameter), such that it can be elastically deformed to apply a radial force inward against the electronics component 300a. As such, the collar body 202, the annular groove 224 and the radial retention component 226 can be tailored to meet the requirements of a particular electronics component, so as to function as intended.

Note that the collar body 202, the annular groove 224, and the radial retention component 226 share a common central axis B, and consequently, a longitudinal axis X of the electronics component 300B is generally collinear with central axis B.

As shown in FIG. 2B, the riser collar portion 215 can have a wall thickness T1 that is greater than a wall thickness T2 of the base collar portion 217. In this manner, the riser collar portion 215 can have a sufficient amount of volume/material to define the annular groove 224 and to support the radial retention component 226, and therefore to effectively support the electronics component 300b. Thus, the outer perimeter surface 216 of the second mounting collar 200 can have a non-uniform thickness along the height H2 of the collar body 202, because of the thickness T1 and the outer diameter or width W3 being greater than width W2 of the base collar portion 217. It is noted that the thickness T1 of the riser collar portion 215 of the second mounting collar 200 can be the same or close to the thickness of the collar body 102 of the first mounting collar 100. In this manner, the base collar portion 217 can be relatively thin (as compared to the thickness of the riser collar portion 215), because one of the purposes of the base collar portion 217 is to provide sufficient axial support to position the riser collar portion 215 at a location above or vertically adjacent one or more first mounting collar(s) 100 to facilitate nesting of adjacent mounting collars 100s and 200s, as further discussed below, but yet the base collar portion 217 does not need to be thick enough to provide support for a retention component as do the riser collar portion 215 of the second mounting collar 200 and the first mounting collar 100. Furthermore, the base collar portion 217 can have a height H3 that is greater than the height H1 of the first mounting collar 100 (FIG. 1B). This elevates or raises the riser collar portion 215 in an axial direction or vertical direction (with reference to the orientation shown in the drawings) relative to the first mounting collar 100 to facilitate nesting of the first and second mounting collars 100 and 200 (see e.g., FIG. 5). Indeed, the first mounting collar 100 can nest within the envelope space or volume formed about the base collar portion 217 and the transition portion 221, and below the riser collar portion 215. This space or volume is shown as recessed profile R.

Note that the terms "above" "below" "elevate" "vertical" and other terms that may infer some orientation are meant for purposes of describing aspects of the first and second mounting collars 100 and 200 as oriented as shown and illustrated in the drawings, and are not meant to be limiting to any particular orientation of the mounting collars when in use as incorporated into an electronics assembly.

Figure 4:
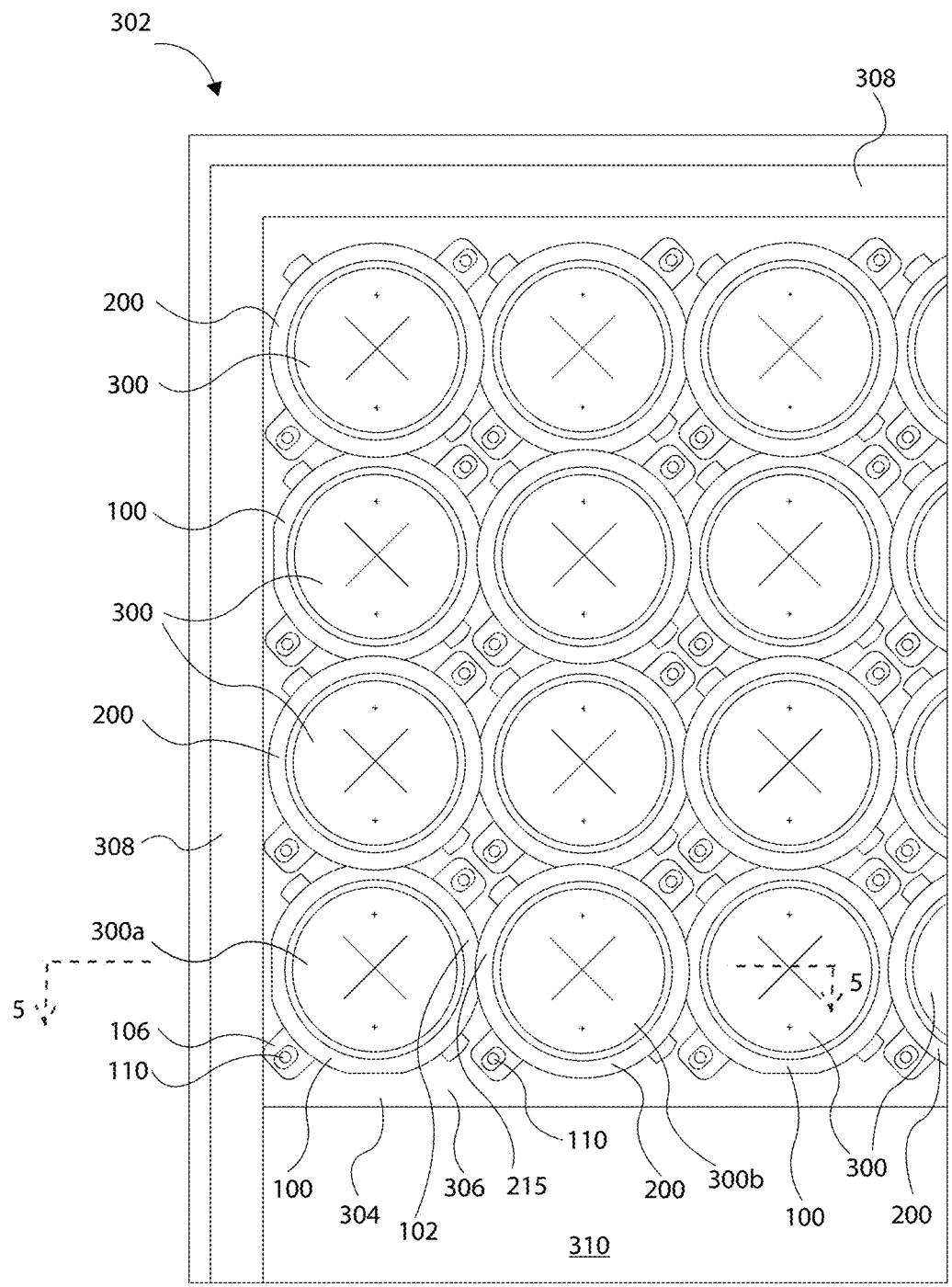
FIG. 4 is a top-down view of a left side portion of the electronics assembly of FIG. 3, further illustrating a plurality of pairs of the first and second mounting collars nested together.
Figure 5:
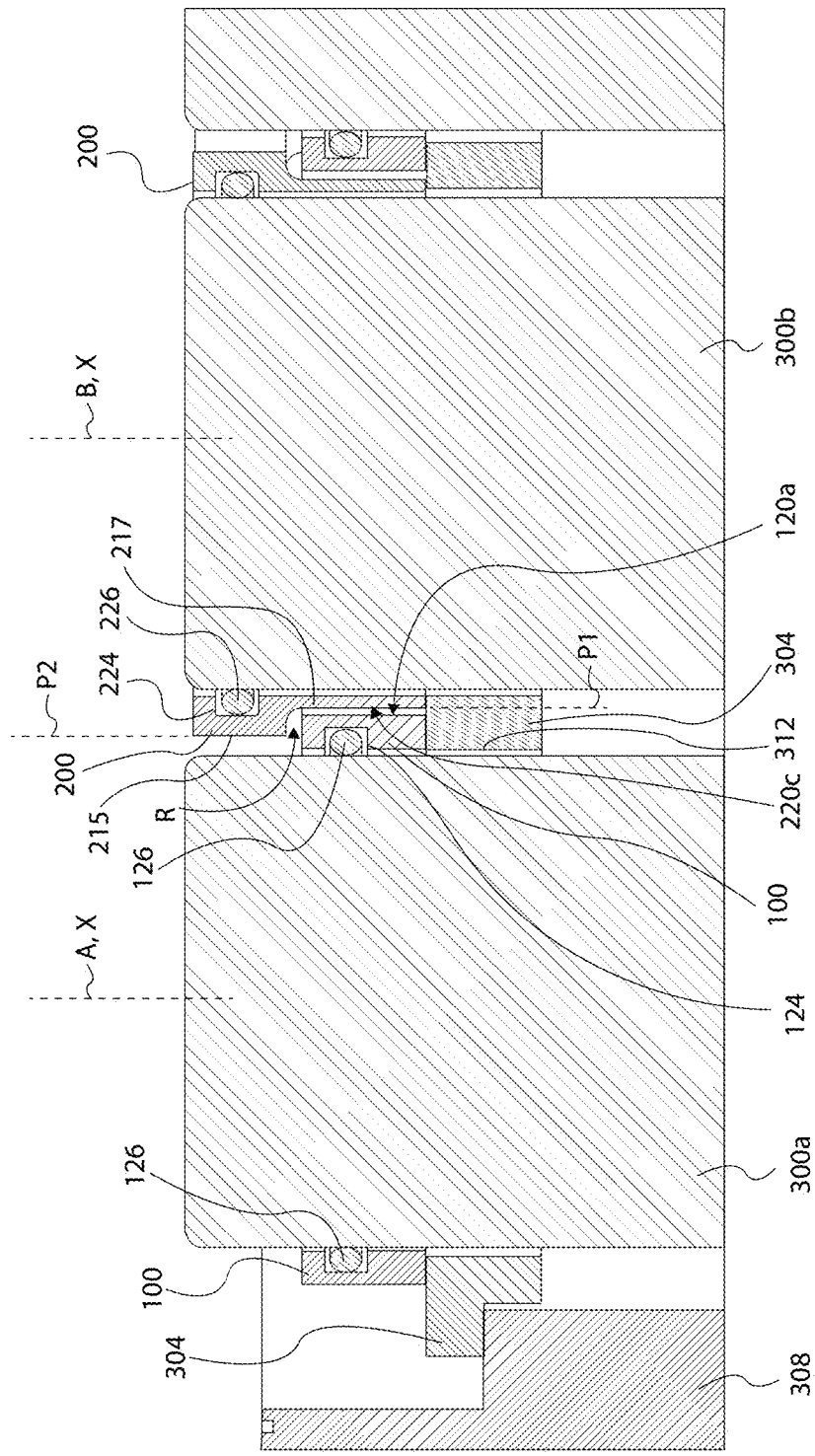
FIG. 5 is a detailed, cross sectional view of a pair of adjacent first and second mounting collars of the plurality of pairs of first and second mounting collars of FIG. 3, taken along lines 5-5 of FIG. 4, further illustrating first and second mounting collars nested together.

With reference to FIGS. 3-5, the electronics assembly 302 can comprise a frame or chassis 308 that supports the support structure 304 and a circuit board 310 (e.g., printed circuit board). The support structure 304 can be a rigid plate that is attached to the chassis 308 by any suitable means. For instance, FIG. 5 shows an edge portion of the support structure 304 having a shoulder that rests on an edge of the chassis 308 (and fasteners can be used to secure the support structure 304 to the chassis 308). Similarly, the circuit board 310 can be attached to the chassis 308 by a suitable means, and can be positioned generally parallel to and spatially separated from the support structure 304.

The support structure 304 can comprise an array of apertures (e.g., see aperture 312) that are sized larger than the size (diameter) of the electronics components (e.g., 300a, 300b). Thus, each electronics component 300 (e.g., a cylindrically shaped capacitor) may extend through respective apertures 312, as illustrated best in FIG. 5. In this arrangement, lower ends of each electronics component (e.g., 300a, 300b) may have pins or leads that are electrically coupled to contact pins or holes (not shown) of the circuit board 310, thereby defining a circuit board coupling interface 314 between each electronics component 300 and the circuit board 310. Note that such interface 314 may not be visible when assembled, but is shown schematically in FIG. 3 for purposes of illustration and discussion.

For larger, high-voltage capacitors (e.g., electronic components 300), there may be four pins or soldered points of contact that define a circuit board coupling interface between the capacitor and the circuit board. Such circuit board coupling interface 314 can be sensitive to strain in a lateral direction (e.g., orthogonal) relative to longitudinal axis X of a particular capacitor, upon shock and/or vibration loads translating transverse to longitudinal axis X (such as potentially experienced by electronics assemblies in harsh environments). Thus, if one or more pins or soldered points of contact are broken or damaged, the capacitor may not operate effectively, and therefore, negatively affect operation of the electronics assembly 302. Advantageously, because each of the first and second mounting collars 100 and 200 comprise a radial retention component (e.g., elastomeric O-ring), at least some of the lateral shock and/or vibration loads can be attenuated by the radial retention component (e.g., 126, 226) to relieve strain on the circuit board coupling interfaces 314. Such loads can be attenuated in the lateral or radial direction relative to the longitudinal axis X of each electronics component 300 (e.g., shock and/or vibration loads in a direction transverse to the longitudinal axis X). These can be loads that are orthogonal to the longitudinal axis X, or loads that have some lateral component, whether orthogonal or less than this.

In examples where the electronics components 300 are high-voltage capacitors (e.g., 30 VDC, or more), an insulation sleeve is typically wrapped around an outer circumferential surface of each capacitor. As noted above, this insulation sleeve should not be removed otherwise the capacitor will not work effectively or properly. Thus, the first and second mounting collars 100 and 200 can be sized and configured to accommodate this. In addition, the radial retention component(s) exemplified herein can be sized and configured to be compressively engaged to the insulation sleeve of the electronics components 300 rather than the components themselves, without removal or modification of the insulation sleeve. The radial retention component(s) exemplified herein can also account for tolerance variations in the diameter of the capacitor and also the thickness of the insulation sleeve, because the radial retention component is selected of a particular type of O-ring (see below), which is elastic and compressible to account for such tolerance variations.

In terms of the nesting structure and functionality, FIG. 4 shows a top-down view of first mounting collars 100 arranged in an alternating manner relative to adjacent second mounting collars 200. Note the overlap between the riser collar portions 215 of the second mounting collars 200 and the collar bodies 102 of the first mounting collars 100, because the collar body (e.g., 102) is laterally situated within the recessed profile R (see FIG. 2B) of the adjacent second mounting collars 200. With this arrangement and the collar configurations described herein, a distance between adjacent electronics components 300 can be reduced or minimized as comparted to prior related clamping devices or systems. Reducing the distance between adjacent electronics components 300 functions to increase the density of the electronics components 300 for a given application, thereby minimizing the xy space or footprint of the circuit board 310 required to support the same number of capacitors as a larger circuit board utilizing prior related clamping devices.

Note that the first and second mounting collars 100 and 200 provide load bearing capabilities of the respective electronics components 300 in a radial direction, and load bearing in the axial direction (i.e., by friction) relative to the longitudinal axis X of the respective electronics components 300.

Advantageously, the electronics components 300 and the first and second mounting collars 100 and 200 can all be installed in a vertical or axial manner relative a central axis A (as compared to traditional clamps that require radial installation or coupling of clamps to capacitors, for instance). More specifically, the electronics components 300 can first be electrically coupled (e.g., pinned, soldered) to the circuit board 310. Then, the support structure 304 can be attached to the chassis 308, as exemplified above, such that upper ends of the electronics components 300 are disposed through respective apertures 312 of the support structure 304. Then, each of the first mounting collars 100 can be slid over the upper ends of alternating electronics components 300 and mounted to the mounting surface 306 of the support structure 304, so that the respective radial retention components 126 (FIG. 1B) of the first mounting collars 100 apply a radial force against their respective electronics components 300. An assembly machine (or a user) can then drive/screw the fasteners 110 into each of the openings 108 of the attachment tabs 106 of each of the first mounting collars 100 in a vertical or axial direction relative to the central axis A, thereby mounting (alternating) electronics components 300 to the support structure 304. After all of the first mounting collars 100 are installed in this manner, the second mounting collars 200 are similarly installed to the support structure 304 with fasteners 110 to mount the remaining/alternating electronics components 300 adjacent first mounting collar(s) 100. Therefore, the first mounting collars 100 are nested relative to adjacent second mounting collars 200, thereby maximizing the density of the electronics components 300. And, the entire installation process of attaching the first and second collars 100 and 200 to the support structure 304 (and therefore mounting the electronics components 300 to the support structure 304) occurs generally in a vertical or axial manner relative to the central axis (A, B) of each of the first and second mounting collars 100 and 200 (and also relative to the longitudinal axis X of each electronics components 300). This minimizes the xy spacing between adjacent first and second mounting collars 100 and 200, because a fastening tool is not required to be engaged to a fastener in a radial direction, as currently performed in the prior art.

As shown in FIG. 4, the first and second mounting collars 100 and 200 can be situated so as to locate their respective mounting tabs 106 and 108 offset radially from one another approximately forty-five degrees in order to provide vertical clearance between adjacent first and second mounting collars 100 and 200, so that the fasteners 110 can be readily inserted into corresponding openings 108 (and threaded into the support structure 304) without interference from the electronics components 300 or the first and second mounting collars 100 and 200. This mounting system further contributes to the low profile arrangement of the first and second mounting collars 100 and 200, because the fasteners 110 can be inserted vertically down into the support structure 304 from above the first and second support collars 100 and 200 (as opposed to being inserted radially, as with traditional clamps).

FIG. 5 shows a cross sectional view of a portion of the electronics assembly 302, further illustrating the nesting configuration of a pair of first and second mounting collars 100 and 200. Note that the mounting surface 120a of the collar body 102 of the first mounting collar 100 is adjacent the mounting surface 220c of the base collar portion 217 of the second mounting collar 200 (in one example, such mounting surfaces 120a and 220c can be biased to each other). This generates a nested arrangement between the first and second mounting collars 100 and 200, because a portion of the collar body 102 is situated within the void or recessed profile R defined by the shape of the base collar portion 217, the transition portion 221, and the riser collar portion 215 of the second mounting collar 200, as detailed above. Said another way, an outer portion of the riser collar portion 215 of the second mounting collar 200 can be laterally situated and configured to extend outwardly beyond a plane P1 defined by the collar body 102. Similarly, an outer portion of the collar body 102 can be laterally situated and configured to extend outwardly beyond a plane P2 defined by the riser collar portion 215 (see also FIGS. 1B and 2B, showing planes P1 and P2).

Note that FIG. 5 illustrates that the radial retention component 226 is located at a different elevation than the radial retention component 126 in an axial direction along the central axis A. This is because the respective support portions of the first and second mounting collars 100 and 200 (i.e., riser collar portion 215, and collar body 102) are located at different elevations relative to each other. Further note that the outer circumferential surface of the electronics component 300a is spatially separated from the inner surface 122 of the first mounting collar 100, because only the radial retention component 126 is shown as being in contact with the electronics component 300a by applying a radial compression force to the electronics component 300a, although such is not to be limiting. The same holds true for the radial retention component 226 and the second mounting collars 200. Similarly, the apertures 312 of the support structure 304 are sized larger than the electronics components 300, so that they fit through respective apertures 312. In accordance with these features, there does not exist a rigid-to-rigid contact between the support structure 304 and the electronics components 300, because the radial retention components can act as a resilient buffer having elastic properties (e.g., elastomeric O-rings), which provides a rigid-to-resilient-to-rigid contact configuration between the support structure 304 (rigid), the first mounting collar 100 (rigid), the radial retention component 126 (resilient/elastic), and to the electronics component 300a (generally rigid), in one example. This rigid-to-resilient-to-rigid arrangement of the present disclosure ensures that the radial retention components perform as intended—to attenuate shock and/or vibration to relieve strain on the circuit board interface coupling 314 between the electronics components 300 and the circuit board 310 (e.g., see FIG. 3).

Note that one of the design aspects of the present disclosure includes selecting an appropriate radial retention component (e.g., the elastomeric O-ring) so that the capacitor, for instance, fits well within the mounting collar. The factors for this design aspect include the size (inside/outside diameter, CS (cross section)), the number (e.g., see the U.S. O-ring sizing chart), and the durometer/harness rating of a particular elastomeric O-ring to accommodate a particular capacitor having a particular diameter tolerance, because if the elastomeric O-ring is too loose around the capacitor, the capacitor will move or wiggle about the mounting collar, and the capacitor may break one or more of the soldering or pinned interfaces electrically coupled to the circuit board. If the O-ring is too small (and/or to stiff), the capacitor will not fit into the particular mounting collar. It is noted herein that the radial retention component may comprise a plurality of radially positioned and supported components rather than a continuous single component. Each of these may be supported within the collar body, and the collective plurality of these can function in a similar manner as the annular or continuous radial retention components discussed herein and shown in the drawings.

The radial retention component can comprise other alternative radial retention features, such as elastomeric plugs that may be radially disposed about an inner surface of a collar body. Alternatively, small set-screws or bolts can be threaded radially through the collar body. In other alternative examples, a particular radial retention component can comprise a gasket, a bumper, or even a collet with radial features that compress inwardly about the capacitor when the collar is rotated or clamped to a support structure.

The collar bodies of the first and second mounting collars can be manufactured by processes involving machining metal (e.g., aluminum), plastic injection molding, 3D printing, or stereolithography processes. The particular collar body material may depend on the size of the capacitor, and the shock loads that may be imparted on the capacitors. In another example, the entire collar body can be a homogeneous component comprised of rubber (or other resilient material), which would eliminate the need for a separate radial retention component (e.g., elastomeric O-ring), because a radial retention feature can be formed inwardly as part of the collar body itself.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A mounting collar, comprising:
    a collar body comprising an opening for receiving at least a portion of an electronics component of an electronics assembly, and a non-uniform outer surface that extends about an entire height of the collar body, the non-uniform outer surface comprising a riser collar portion and a base collar portion, the riser collar portion having a width greater than that of the base collar portion, such that the collar body is nestable with a collar body of an adjacent mounting collar supported by the electronics assembly; and
    a radial retention component supported about an inner surface of the opening of the collar body, the radial retention component being operable to apply a radial force on the electronics component to at least partially support the electronics component.

2. The mounting collar of claim 1, wherein the collar body comprises an annular groove formed about the inner surface, and wherein the radial retention component is at least partially disposed within the annular groove.

3. The mounting collar of claim 2, wherein the radial retention component comprises an elastomeric O-ring operable to elastically deform to apply the radial force on the electronics component.

4. The mounting collar of claim 1, wherein the radial retention component is configured to provide axial and lateral support of the electronics component.

5. The mounting collar of claim 1, wherein the collar body comprises a uniform outer surface that extends about an entire height of the collar body.

6. The mounting collar of claim 1, further comprising at least one attachment tab extending from the collar body operable to receive a fastener in an axial direction relative to a central axis of the collar body to facilitate attaching the mounting collar to a support structure of the electronics assembly in an axial direction.

7. A mounting system for mounting electronic components within an electronics assembly, comprising:
    a first mounting collar coupleable to a support structure of an electronics assembly, and comprising a collar body for mounting a first electronics component to the support structure; and
    a second mounting collar coupleable to the support structure adjacent the first mounting collar, the second mounting collar comprising a collar body for mounting a second electronics component to the support structure, the collar body having a riser collar portion and a base collar portion, the riser collar portion having a body width greater than that of the base collar portion,
    wherein the collar body of the first mounting collar is operable to nest with the second mounting collar at a position adjacent the base collar portion when the first and second mounting collars are coupled to the support structure.

8. The mounting system of claim 7, further comprising a first radial retention component supported about an inner surface of the collar body of the first mounting collar, and further comprising a second radial retention component supported about an inner surface of the collar body of the second mounting collar, each radial retention component being operable to apply a radial force on the respective first and second electronics components.

9. The mounting system of claim 8, wherein each of the first and second mounting collars comprises an annular groove, and wherein each radial retention component comprises an elastomeric O-ring retained within a respective annular groove.

10. The mounting system of claim 7, further comprising a plurality of first mounting collar attached to the support structure, and a plurality of second mounting collars attached to the support structure and nested with adjacent first mounting collars.

11. An electronics assembly, comprising:
    a chassis;
    a circuit board coupled to the chassis;
    a support structure coupled to the chassis and spatially separated from the circuit board, and comprising an array of apertures;
    a plurality of electronics components electrically coupled to the circuit board and extending through respective apertures of the support structure;
    a plurality of first mounting collars attached to the support structure for mounting respective electronics components to the support structure; and
    a plurality of second mounting collars attached to the support structure for mounting respective electronics components to the support structure, the second mounting collars arranged in an alternating manner relative to the first mounting collars,
    wherein the first mounting collars are nested relative to adjacent second mounting collars to maximize the density of the electronics components relative to the circuit board.

12. The electronics assembly of claim 11, wherein each of the first and second mounting collars comprises an annular groove and an elastomeric O-ring supported by the annular groove, wherein each elastomeric O-ring is operable to elastically deform and apply a radial force on the respective electronics components.

13. The electronics assembly of claim 12, wherein the annular groove of each of the first mounting collars is situated at a different height than that of each annular groove of the second mounting collars, and wherein a height of each of the first mounting collars is less than that of the each of the second mounting collars.

14. The electronics assembly of claim 12, wherein each electronics component comprises a capacitor electrically coupled to the circuit board about a circuit board coupling interface, and wherein each elastomeric O-ring operates to at least one of absorb shock or attenuate vibration to relieve lateral strain about the circuit board coupling interface.

15. The electronics assembly of claim 11, wherein each of the second mounting collars comprises a riser collar portion and a base collar portion, the riser collar portion having a wall width greater than that of the base collar portion, and wherein each of the first mounting collars is nested with adjacent second mounting collars at a position adjacent the base collar portion.

16. The electronics assembly of claim 11, further comprising fasteners coupling the first and second mounting collars to the support structure, wherein each fastener comprises a central axis that is generally parallel to a longitudinal axis of each electronics component, such that the first and second mounting collars are installable to the support structure in an axial manner relative to the longitudinal axis.

17. A method of mounting a plurality of electronics components to an electronics assembly, comprising:
    electrically coupling a plurality of electronics components to a circuit board supported by a chassis;
    attaching a support structure to the chassis, such that ends of the plurality of electronics components are disposed through respective apertures of the support structure;
    attaching a plurality of first mounting collars to the support structure in an alternating manner for mounting respective electronics components to the support structure;
    attaching a plurality of second mounting collars to the support structure in an alternating manner relative to the first mounting collars for mounting respective electronics components to the support structure, wherein the first mounting collars are nested relative to adjacent second mounting collars to maximize the density of the electronics components relative to the circuit board.

18. The method of claim 17, wherein attaching the first and second mounting collars comprises driving fasteners through each of the first and second mounting collars and into the support structure in an axial direction relative to a longitudinal axis of each electronics component.

19. The method of claim 17, wherein attaching the first and second mounting collars to the support structure further comprises facilitating applying a radial force against each electronics component via a radial retention component supported about by each of the first and second mounting collars.

20. The method of claim 19, wherein each of the first and second mounting collars comprises an annular groove formed about an inner surface of the collar body, and wherein each radial retention component comprises an elastomeric O-ring that is at least partially disposed within respective annular grooves to apply the radial force to respective electronics components.

21. The method of claim 17, further comprising facilitating relieving strain about a circuit board coupling interface between each electronics component and the circuit board by providing an elastomeric O-ring supported by each of the first and second mounting collars to at least one of absorb shock or attenuate vibration exerted on the electronics assembly.

* * * * *